(12) United States Patent
Parris et al.

(10) Patent No.: US 7,916,567 B2
(45) Date of Patent: Mar. 29, 2011

(54) TWIN CELL ARCHITECTURE FOR INTEGRATED CIRCUIT DYNAMIC RANDOM ACCESS MEMORY (DRAM) DEVICES AND THOSE DEVICES INCORPORATING EMBEDDED DRAM

(75) Inventors: Michael C. Parris, Colorado Springs, CO (US); Douglas B. Butler, Colorado Springs, CO (US)

(73) Assignee: ProMOS Technologies Pte. Ltd, Singapore (SG)

( * ) Notice: Subject to any disclaimer, the term of this patent is extended or adjusted under 35 U.S.C. 154(b) by 173 days.

(21) Appl. No.: 12/044,664

(22) Filed: Mar. 7, 2008

(65) Prior Publication Data

US 2009/0225613 A1     Sep. 10, 2009

(51) Int. Cl.
*G11C 7/00*     (2006.01)
*G11C 7/06*     (2006.01)
(52) U.S. Cl. .................... 365/203; 365/205; 365/230.06
(58) Field of Classification Search .................. 365/205, 365/190
See application file for complete search history.

(56) References Cited

U.S. PATENT DOCUMENTS

| 4,864,374 | A |   | 9/1989 | Banerjee |
|---|---|---|---|---|
| 4,982,367 | A | * | 1/1991 | Miyatake ...................... 365/203 |
| 6,097,623 | A | * | 8/2000 | Sakata et al. .................. 365/145 |
| 6,272,054 | B1 |   | 8/2001 | Barth, Jr. et al. |
| 6,903,961 | B2 |   | 6/2005 | Tsukikawa et al. |

FOREIGN PATENT DOCUMENTS

| JP | 2003273245 | * | 1/2003 |
|---|---|---|---|
| JP | 2003-273245 | * | 3/2003 |
| JP | 2006-127665 | * | 5/2006 |

* cited by examiner

*Primary Examiner* — Hoai V Ho
*Assistant Examiner* — James G Norman
(74) *Attorney, Agent, or Firm* — William J. Kubida; Peter J. Meza; Hogan Lovells US LLP

(57) ABSTRACT

A twin cell architecture for dynamic random access memory (DRAM) devices and those devices incorporating embedded DRAM utilizing an open bitline configuration is disclosed. The twin cell architecture disclosed has significant advantages over conventional designs in terms of power, radiation hardness and speed and does not require intermediate supply voltage bitline precharge while allowing for 6F2 memory cell layouts.

33 Claims, 12 Drawing Sheets

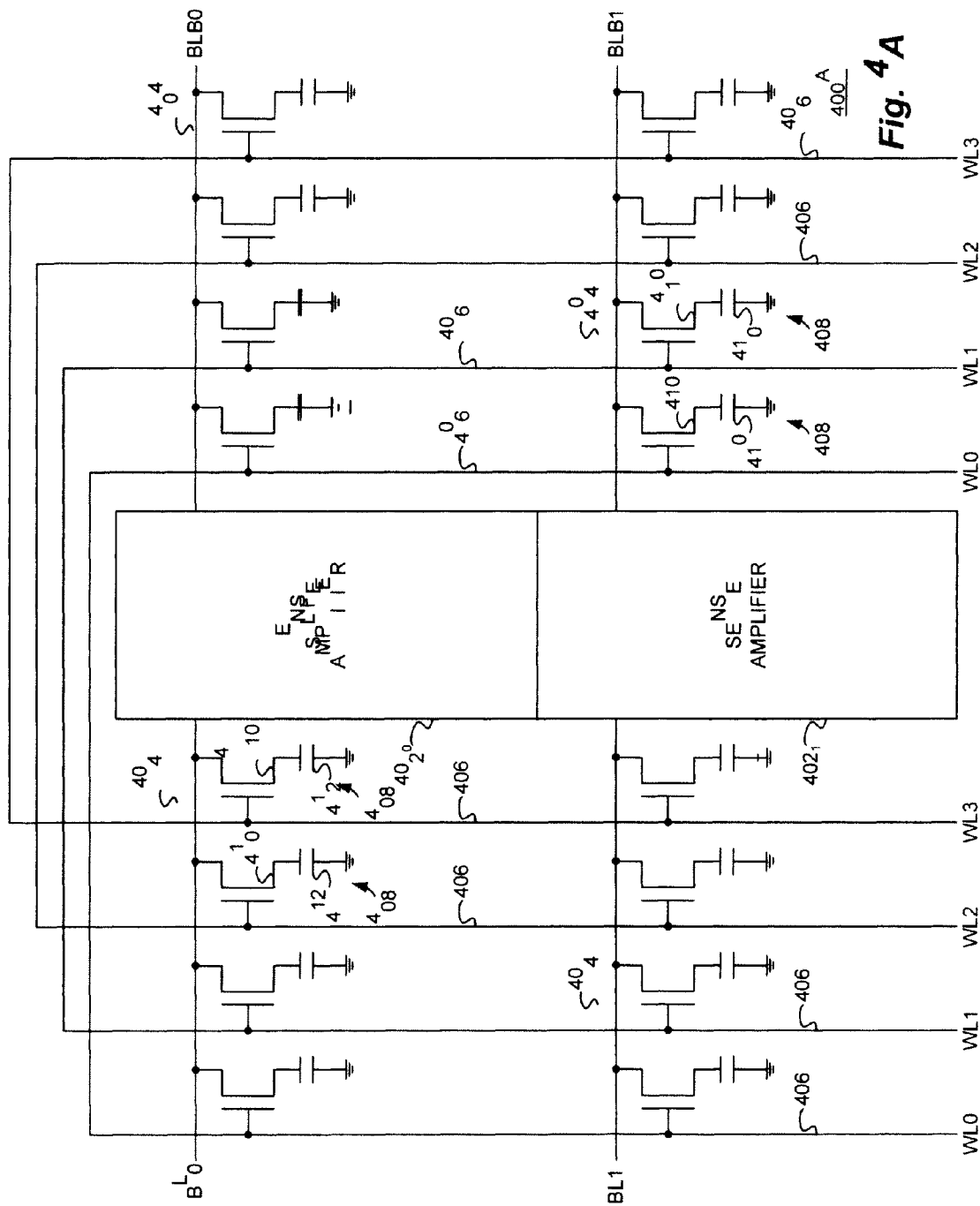

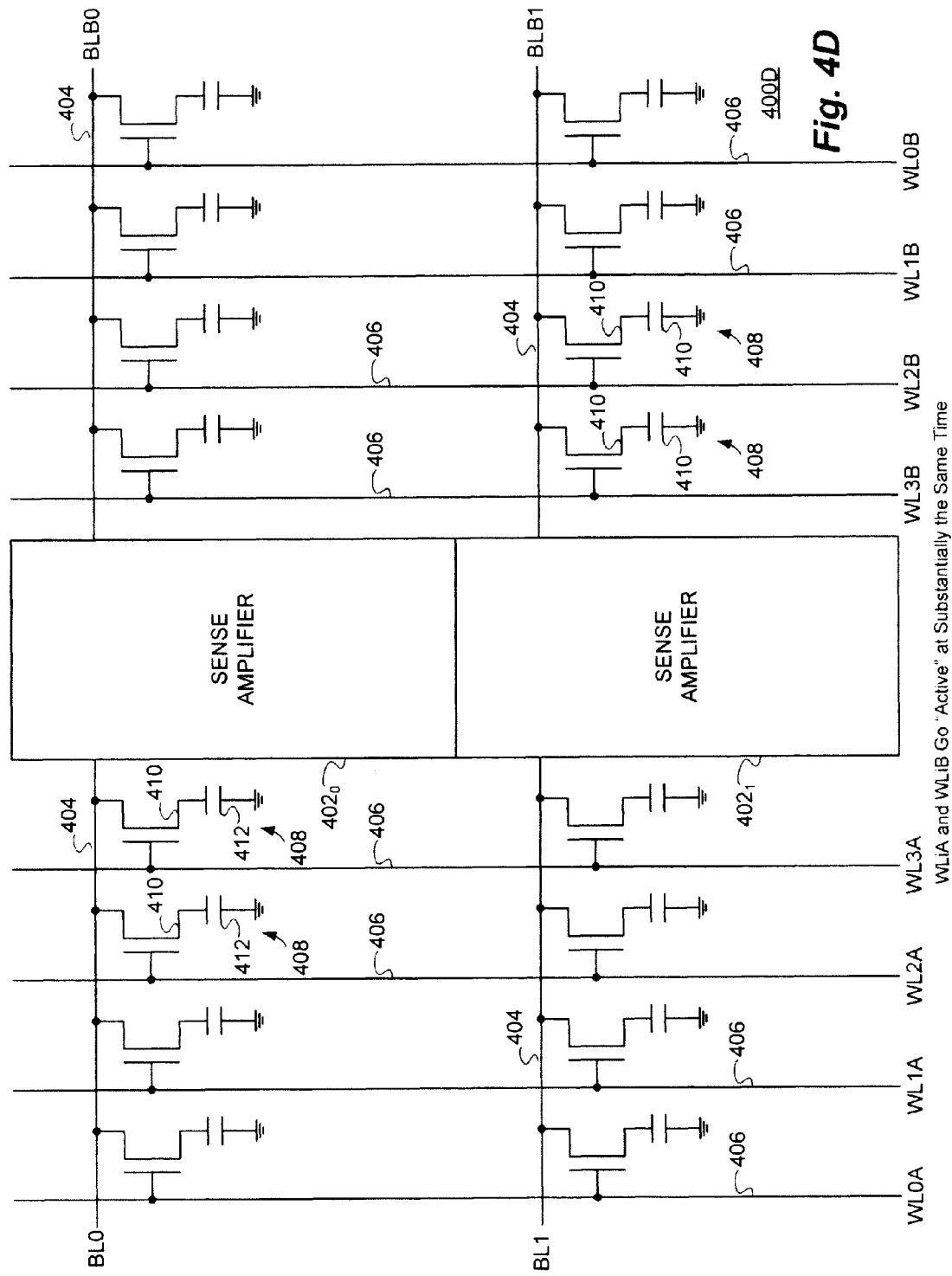

600

800

TWIN CELL ARCHITECTURE FOR INTEGRATED CIRCUIT DYNAMIC RANDOM ACCESS MEMORY (DRAM) DEVICES AND THOSE DEVICES INCORPORATING EMBEDDED DRAM

BACKGROUND OF THE INVENTION

The present invention relates, in general, to the field of integrated circuit (IC) memory devices. More particularly, the present invention is related to a twin cell architecture for dynamic random access memory (DRAM) devices and those devices incorporating embedded DRAM.

Power is a large concern for today's integrated circuit memory devices. Many present day applications are mobile, and extended battery life can provide a key market advantage. Nevertheless, for applications that are not battery powered, power is also important. Power consumption leading to device heating problems can add extra expense to systems in the way of cooling fans or larger heat sinks. High power consumption in memory circuits may also require the system to operate at reduced clock frequencies.

Radiation hardness is a reliability problem for semiconductor integrated circuits. Military, space and consumer applications all require low failure rate levels. If failures due to radiation are too high in consumer products, additional expenses are incurred in implementing error correction code (ECC) logic or additional ECC capability. If failure rates due to radiation effects are too high for governmental applications, typically after ECC has already been employed, the product will be rejected for such an application.

For network, internet, gaming and other applications, random access cycle time (or the $t_{RC}$ specification for DRAMs) is desired to be minimized. Historically, static random access memory devices (SRAMs) have a large advantage over DRAMs in providing this type of device performance. What is needed then is a memory circuit with the higher density of DRAM memories in conjunction with the faster random cycle time performance of SRAM memories.

It is also known that grounded bitline precharge designs require complicated reference voltage circuitry. For certain very low voltage applications, grounded bitline, or supply voltage level (e.g. VCC) bitline precharge, designs are required for DRAM memory arrays. These non-VCC/2 bitline precharge designs require a reference voltage that is challenging to generate for reliable bitline sensing.

DRAM memory circuits are generally optimized on a cost per bit basis. This cost may be minimized by minimizing the DRAM memory cell footprint. Most DRAM manufacturers are currently implementing a cell that is referred to as an 8F squared cell, or 8F2, where F represents the minimum photolithography feature size for a given technology node. For example, at the 70 nm design node, a memory cell may be 8×70n² or 0.0392 square microns in size. Some advanced memory cell technologies have the capability to utilize 6F squared memory cells. In the foregoing example, a 6F squared (6F2) cell can be implemented in an area of 0.0294 square microns. Most 6F2 DRAM cells require open bitline architectures as opposed to the well known folded bitline sub-array architecture. Nevertheless, conventional open bitline sub-arrays can be inefficient and prone to noise related problems.

SUMMARY OF THE INVENTION

The twin cell architecture for dynamic random access memory (DRAM) devices, and those devices incorporating embedded DRAM, of the present invention provides significant advantages over conventional memory designs in a number of the above-described categories.

With respect to power, the present invention allows for longer memory cell refresh intervals. Since a "one" (or logic high level) and a "zero" (or logic low level) are stored in complementary cells, the high level can leak down to a much lower level before a failure occurs. This results in a longer allowable time in between refresh operations. The power required to perform refreshes is perhaps the largest contributor to power consumption during self refresh mode (or sleep mode) where data is maintained but most of the associated DRAM circuits are powered down. In certain applications the memory can remain in sleep mode for a significant period of time.

The present invention also allows for the use of a non-boosted wordline level. The practice of including on-chip charge pumps and generating a voltage level two, three or more times higher than the regular supply voltage level (VCC) or VINT (VCC internal) for wordlines is very inefficient. The twin memory cell design of the present invention can operate with a non-boosted wordline high level and a poor logic one level restored into the memory cell since there is always complementary data stored.

With respect to radiation tolerance, in accordance with the present invention a single bit of data is stored in two separate DRAM sub-arrays and the two different memory cells comprising one bit of data are separated by comparatively large distances. This decreases the likelihood that a single alpha particle, or radiation "hit", will effect both memory cells allowing the data to remain intact.

A common failure mode for radiation exposed complementary metal oxide semiconductor (CMOS) memory circuits is latch-up. Since transistor well biasing relies on pumped power supplies, VPP, VNWL and VBB, prevention of latch-up requires that these voltages remain at their designed levels. The charge pump used to generate these voltages is vulnerable to radiation hits and can be altered in a high radiation environment. A non-boosted power supply memory device which may be provided in accordance with the twin cell design of the present invention eliminates this radiation risk.

Moreover, radiation "hits" typically generate a leakage path for stored charge to dissipate. With complementary data where logic level "ones" can leak away and logic level "zeroes" would leak to a stronger level, the twin cell design of the present invention also provides more radiation durability.

With respect to operating speed, sensing speed is improved utilizing the memory design disclosed herein since a logic level "zero" is always read on either the bitline (BL) or its complementary bitline bar (BLB), and this "zero" signal emerges more quickly than a logic level "one". The "zero" signal will be transferred to the bitlines when the wordline is a threshold voltage above ground whereas a "one" signal is delayed until the wordline is a threshold voltage ($V_t$) above the bitline precharge level.

Cell node restore time is also improved. Restoring a logic level one into a DRAM cell is a relatively slow process since the memory cell pass gate is in a source follower configuration during this period of time. The cell node asymptotically approaches a high level as the $V_t$ of the pass gate is reached. Since complementary data is stored with the design of the present invention, the level of a logic level one stored can be reduced or cut off and the total restore time reduced. This improved restore time improves both the write cycle and read cycle speeds and therefore, random access times.

Further with respect to conventional bitline precharge, the present invention allows for the use of a non-VCC/2 bitline precharge. Since complementary data is stored, no reference voltage is needed. This allows the DRAM to easily work with grounded or VCC precharged bitlines.

Still further with respect to memory cell size, the present invention can be implemented in conjunction with a 6F2 memory cell technology. Since an open bitline architecture is utilized, 6F2 memory cells comprise a relatively straightforward technology drop-in.

Particularly disclosed herein is an integrated circuit device including a memory array comprising at least one sense amplifier and at least one complementary bitline pair, a first bitline of the pair extending distally from the sense amplifier in a first direction and a second bitline of the pair extending distally from the sense amplifier in a second opposite direction. A plurality of associated wordline pairs are disposed orthogonally to the first and second bitlines, a first wordline of the wordline pairs intersecting the first bitline and a second wordline of the wordline pairs intersecting the second bitline. A memory cell is coupled to each of the first and second wordlines of the wordline pairs at an intersection with each of the first and second bitlines respectively.

Also particularly disclosed herein is an integrated circuit device including a memory array comprising at least one sense amplifier coupled to first and second complementary bitlines extending outwardly in opposite directions. The memory array further comprises first through n wordline pairs, a first wordline of each of the wordline pairs being disposed orthogonally to the first bitline and a second wordline of the wordline pairs being disposed orthogonally to the second bitline. At least one memory cell is coupled to the first and second complementary bitlines at a point of intersection with each of the first and second wordlines of the wordline pairs respectively.

Also further disclosed herein is an integrated circuit device comprising a plurality of sense amplifiers and a like plurality of complementary bitline pairs, a respective one of the complementary bitline pairs being coupled to each one of the plurality of sense amplifiers in an open bitline configuration. A plurality of wordlines are disposed orthogonally to the complementary bitline pairs and at least two memory cells are coupled to each of the plurality of wordlines and each of the complementary bitline pairs.

Still further particularly disclosed herein is an integrated circuit device comprising a sense amplifier with a first bitline extending from the sense amplifier in a first direction and a complementary second bitline extending from the sense amplifier in a second opposite direction. First through n wordlines are disposed orthogonally to each of the first and second bitlines and a memory cell is coupled to each of the wordlines and each of the first and second bitlines.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 4A-4D are schematic illustrations of various representative embodiments of a twin cell DRAM architecture in accordance with the present invention utilizing an open bitline architecture and having two cells per bit;

DESCRIPTION OF A REPRESENTATIVE EMBODIMENT

Figure 1:
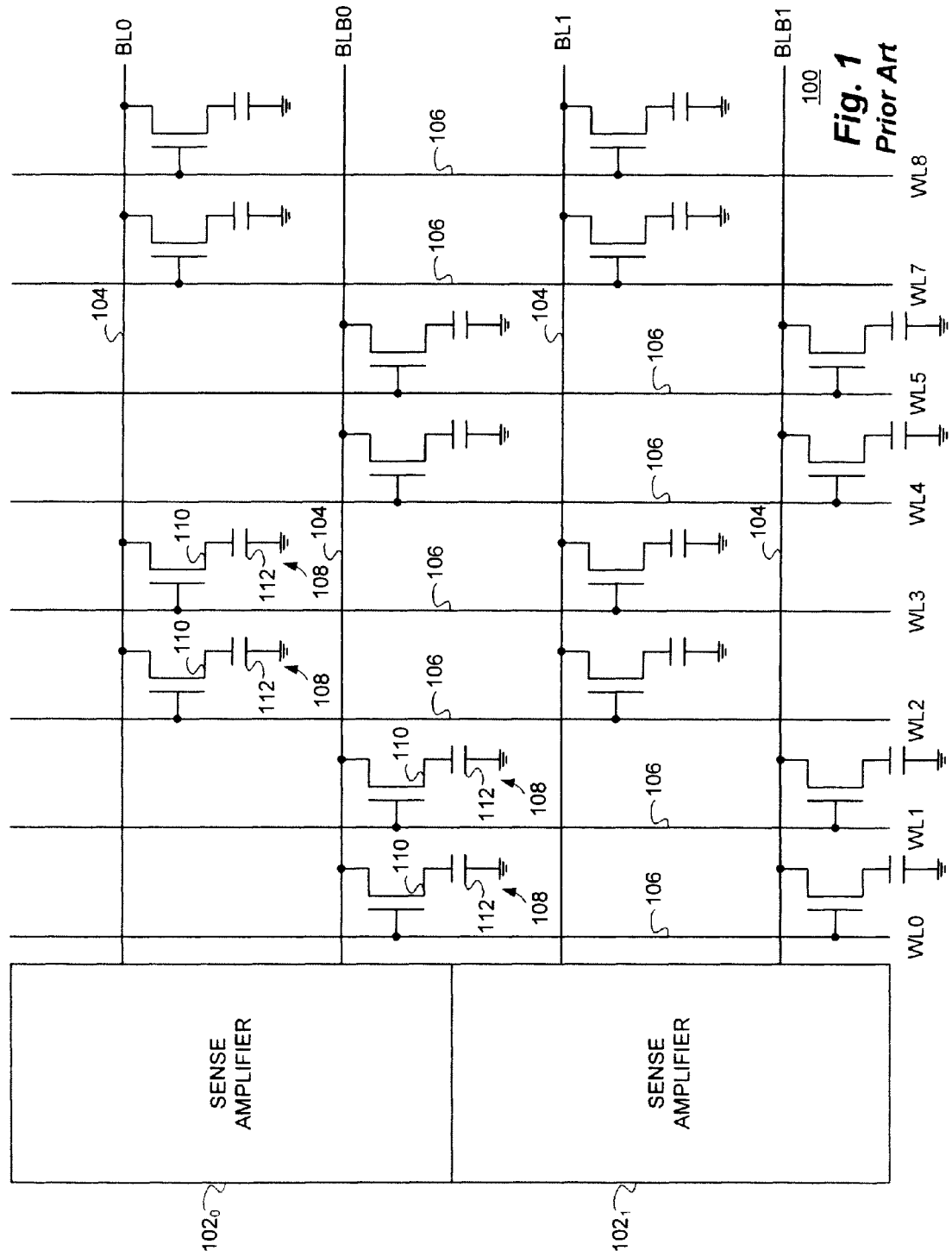
FIG. 1 is a simplified schematic illustration of a conventional folded bitline DRAM architecture having one cell per bit.

With reference now to FIG. 1, a simplified schematic illustration of a conventional folded bitline DRAM 100 architecture having one cell per bit is shown. The DRAM 100 comprises, for purposes of illustration, two sense amplifiers $102_0$ and $102_1$ both of which are coupled to, and located to one side of, a pair of complementary bitlines 104 in a conventional folded bitline configuration. As illustrated, sense amplifier $102_0$ is coupled to bitlines BL0 and BLB0 while sense amplifier $102_1$ is coupled to bitlines BL1 and BLB1.

A number of wordlines 106 (labeled WL0 through WL8, for example) are placed orthogonally to the complementary bitline 104 pairs. At the intersection of each of the wordlines 106 and complementary bitlines 104, a memory cell 108 is located comprising a single transistor 110 and capacitor 112, in the one-transistor, one-capacitor (1T/1C) embodiment illustrated. The transistor 110 has its drain connected to one of the complementary bitlines 104, its source connected to circuit ground (VSS) through the corresponding capacitor 112 and its gate connected to one of the adjacent wordlines 106.

Figure 2:
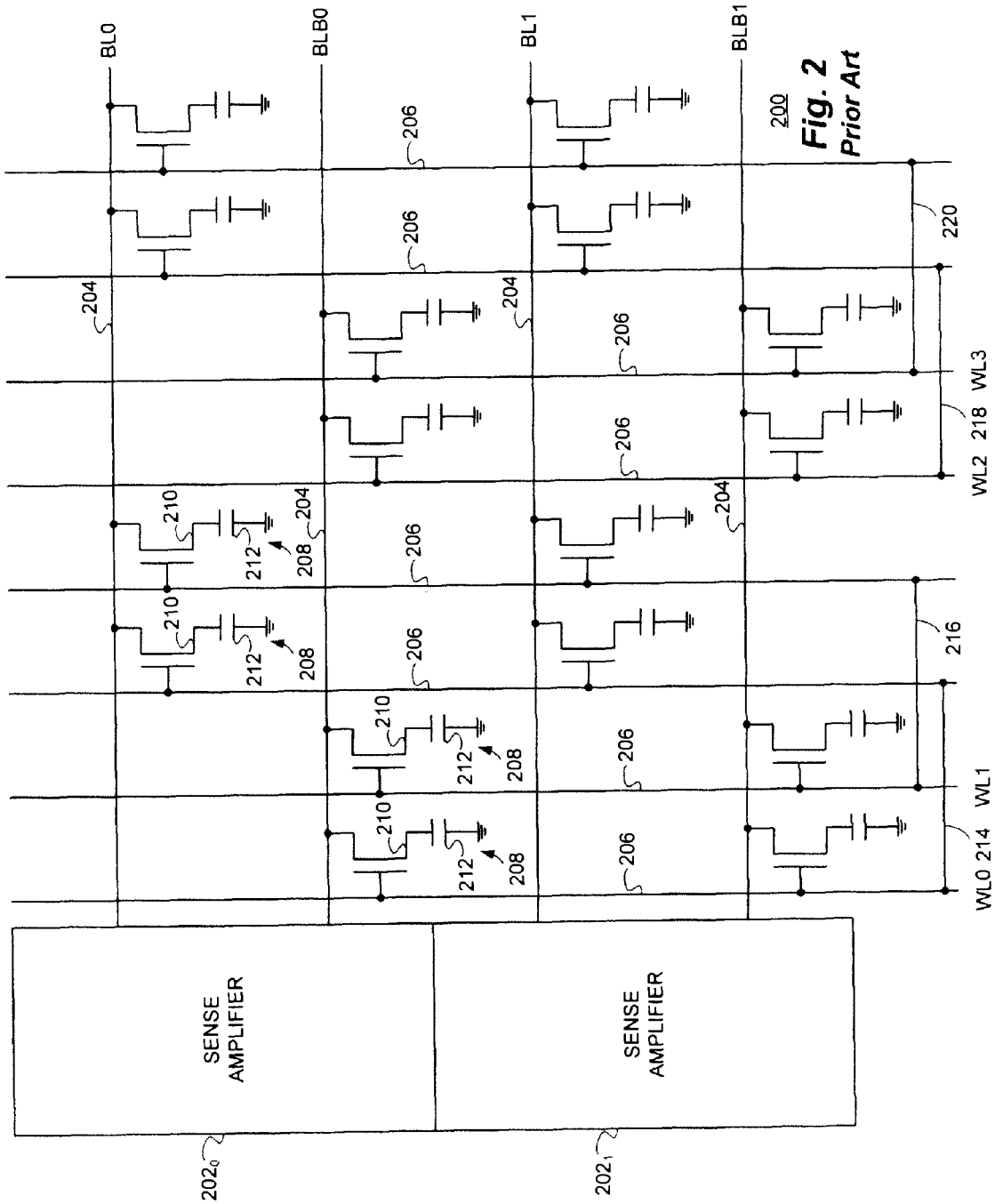
FIG. 2 is a simplified schematic illustration of a conventional folded bitline twin cell DRAM architecture having two cells per bit.

With reference additionally now to FIG. 2, a simplified schematic illustration of a conventional folded bitline twin cell DRAM 200 architecture having two cells per bit is shown. The DRAM 200 comprises, for purposes of illustration, two sense amplifiers $202_0$ and $202_1$ both of which are coupled to, and located to one side of, a pair of complementary bitlines 204 in a conventional folded bitline configuration. As illustrated, sense amplifier $202_0$ is coupled to bitlines BL0 and BLB0 while sense amplifier $202_1$ is coupled to bitlines BL1 and BLB1.

A number of wordlines 206 (labeled WL0 through WL3, for example) are placed orthogonally to the complementary bitline 204 pairs. At the intersection of each of the wordlines 206 and complementary bitlines 204, a memory cell 208 is located comprising a single transistor 210 and capacitor 212, in the 1T/1C embodiment illustrated. The transistor 210 has its drain connected to one of the complementary bitlines 204, its source connected to circuit ground (VSS) through the corresponding capacitor 212 and its gate connected to one of the adjacent wordlines 206.

In this particular embodiment, the DRAM 200 further includes a connection between alternating ones of wordlines 206 such that WL0 is connected by connection 214 to the wordline 206 on the other side of WL1 while WL1 is connected by connection 216 to another of the wordlines 206 as shown. Similarly, the DRAM 200 further includes additional connections between alternating ones of the wordlines 206 such that WL2 is connected by connection 218 to the wordline 206 on the other side of WL3 while WL3 is connected by connection 220 to another of the wordlines 206 as shown.

Figure 3:
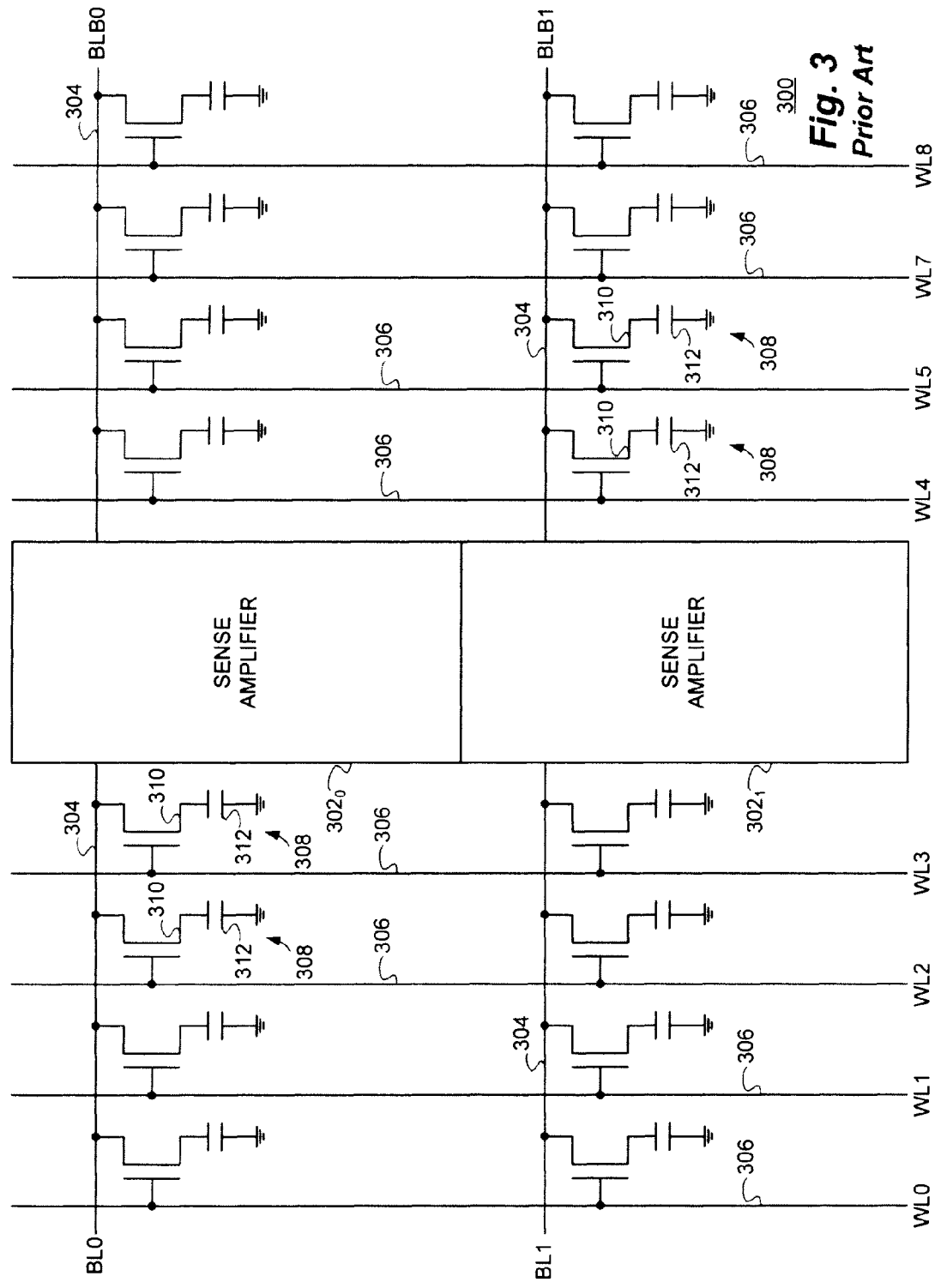
FIG. 3 is a simplified schematic illustration of a conventional open bitline DRAM architecture having one cell per bit.

With reference additionally now to FIG. 3, a simplified schematic illustration of a conventional open bitline DRAM 300 architecture having one cell per bit is shown. The DRAM 300 comprises, for purposes of illustration, two centrally located sense amplifiers $302_0$ and $302_1$ both of which are coupled to a pair of complementary bitlines 304 in a conventional open bitline configuration. As illustrated, sense amplifier $302_0$ is coupled to distally extending bitlines BL0 and BLB0 while sense amplifier $102_1$ is coupled to bitlines BL1 and BLB1.

A number of wordlines 306 (labeled WL0 through WL8, for example) are placed orthogonally to the complementary bitline 304 pairs. At the intersection of each of the wordlines 306 and complementary bitlines 304, a memory cell 308 is located comprising a single transistor 310 and capacitor 312, in the 1T/1C embodiment illustrated. The transistor 310 has its drain connected to one of the complementary bitlines 304, its source connected to circuit ground (VSS) through the corresponding capacitor 312 and its gate connected to one of the adjacent wordlines 306.

With reference additionally now to FIGS. 4A through 4D inclusive, schematic illustrations of various representative twin cell architectures (respectively DRAMs 400A through 400D) in accordance with the present invention are shown utilizing an open bitline architecture and having two cells per bit.

With respect to the embodiment of FIG. 4A in particular, the DRAM 400A comprises, for purposes of illustration, two centrally located sense amplifiers $402_0$ and $402_1$ both of which are coupled to a pair of complementary bitlines 404 in an open bitline configuration. As illustrated, sense amplifier $402_0$ is coupled to distally extending bitlines BL0 and BLB0 while sense amplifier $402_1$ is coupled to bitlines BL1 and BLB1.

In this instance, a number of wordlines 406 (labeled WL0 through WL3, for example) are placed orthogonally to the complementary bitline 404 pairs. To the left side of the sense amplifiers $402_0$ and $402_1$ the wordlines 406 are placed such that the highest numbered one (e.g. WL3) is located nearest the sense amplifiers $402_0$ and $402_1$ and the lowest numbered one (e.g. WL0) is located most remotely. The intervening wordlines 406 are placed such that they decrement between the highest and lowest numbered ones as shown.

On the other hand, to the right side of the sense amplifiers $402_0$ and $402_1$ the wordlines 406 are placed such that the lowest numbered one (e.g. WL0) is located nearest the sense amplifiers $402_0$ and $402_1$ and the highest numbered one (e.g. WL3) is located most remotely. The intervening wordlines 406 are placed such that they increment between the lowest and highest numbered ones as shown.

At the intersection of each of the wordlines 406 and complementary bitlines 404, a memory cell 408 is located comprising a single transistor 410 and capacitor 412, in the 1T/1C embodiment illustrated. The transistor 410 has its drain connected to one of the complementary bitlines 404, its source connected to circuit ground (VSS) through the corresponding capacitor 412 and its gate connected to one of the adjacent wordlines 406.

Figure 4B:
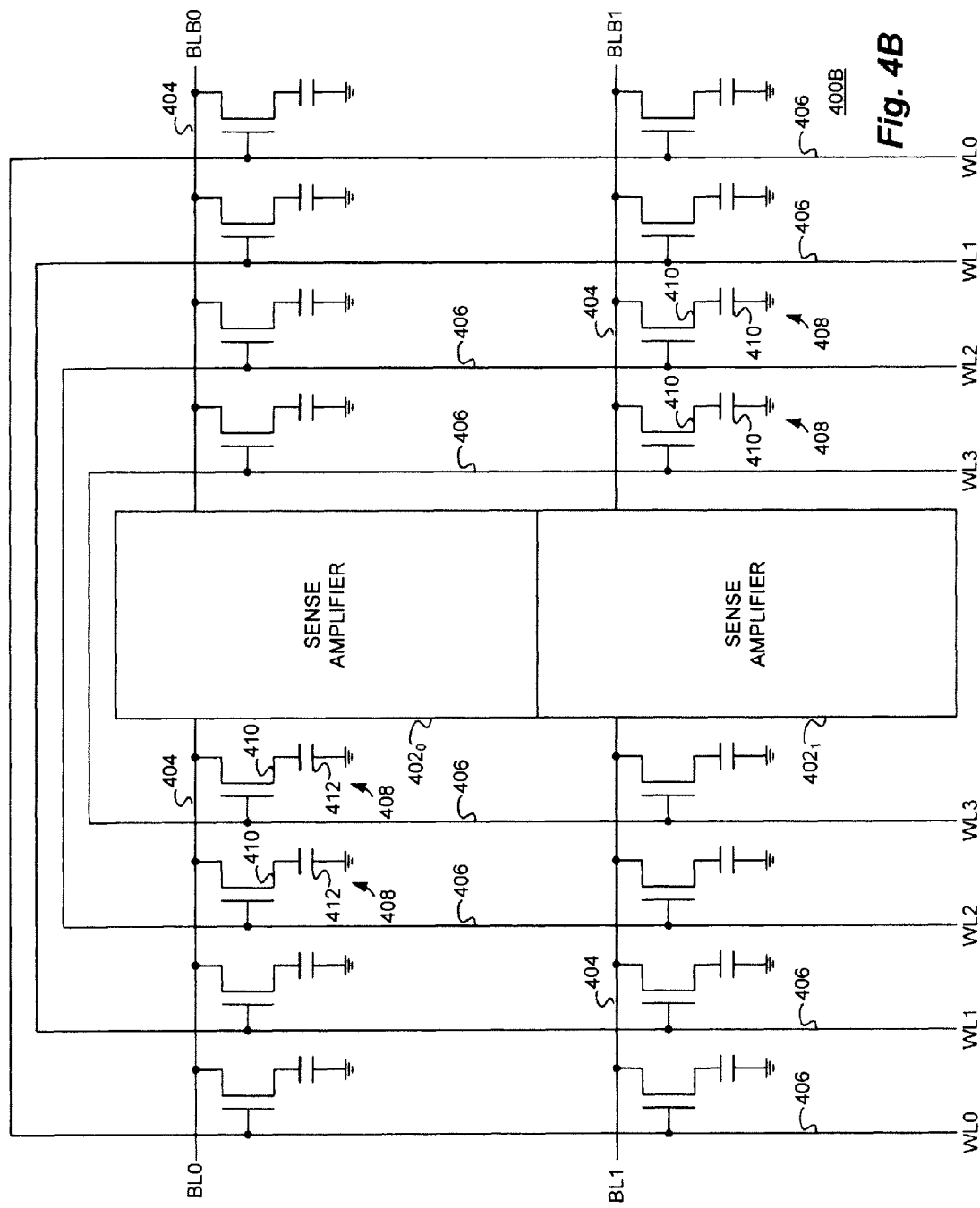

With respect to the embodiment of FIG. 4B in particular, the DRAM 400B also comprises for purposes of illustration, two centrally located sense amplifiers $402_0$ and $402_1$ both of which are coupled to a pair of complementary bitlines 404 in an open bitline configuration. As illustrated, sense amplifier $402_0$ is coupled to distally extending bitlines BL0 and BLB0 while sense amplifier $402_1$ is coupled to bitlines BL1 and BLB1.

In this instance, a number of wordlines 406 (labeled WL0 through WL3, for example) are placed orthogonally to the complementary bitline 404 pairs. To the left side of the sense amplifiers $402_0$ and $402_1$ the wordlines 406 are placed such that the highest numbered one (e.g. WL3) is located nearest the sense amplifiers $402_0$ and $402_1$ and the lowest numbered one (e.g. WL0) is located most remotely. The intervening wordlines 406 are placed such that they decrement between the highest and lowest numbered ones as shown.

On the other hand, to the right side of the sense amplifiers $402_0$ and $402_1$ the wordlines 406 are placed such that the highest numbered one (e.g. WL3) is located nearest the sense amplifiers $402_0$ and $402_1$ and the lowest numbered one (e.g. WL0) is located most remotely. The intervening wordlines 406 are placed such that they decrement between the highest and lowest numbered ones as shown.

Again, at the intersection of each of the wordlines 406 and complementary bitlines 404, a memory cell 408 is located comprising a single transistor 410 and capacitor 412, in the 1T/1C embodiment illustrated. The transistor 410 has its drain connected to one of the complementary bitlines 404, its source connected to circuit ground (VSS) through the corresponding capacitor 412 and its gate connected to one of the adjacent wordlines 406.

Figure 4C:
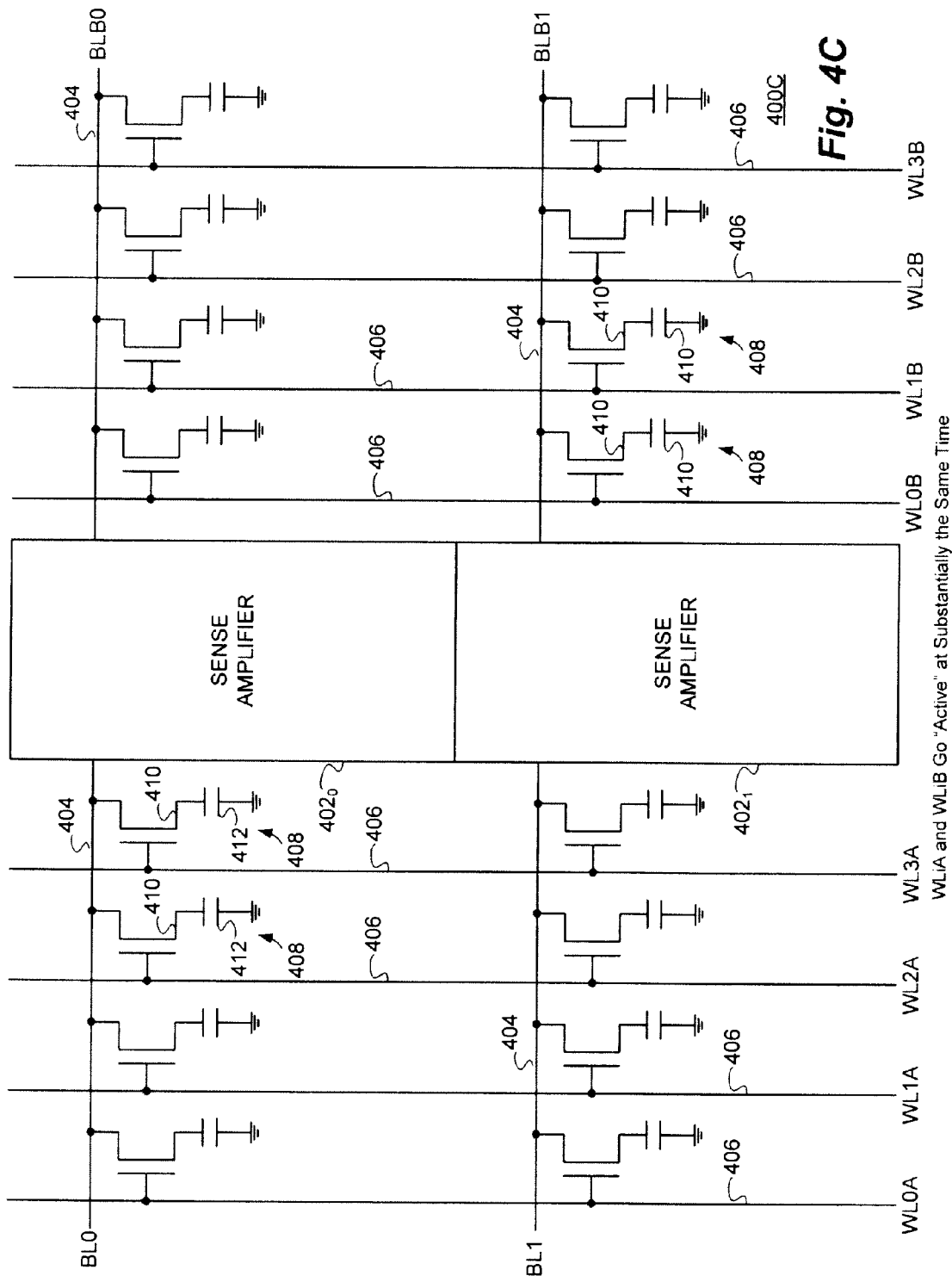

With respect to the embodiment of FIG. 4C in particular, the DRAM 400C also comprises for purposes of illustration, two centrally located sense amplifiers $402_0$ and $402_1$ both of which are coupled to a pair of complementary bitlines 404 in an open bitline configuration. As illustrated, sense amplifier $402_0$ is coupled to distally extending bitlines BL0 and BLB0 while sense amplifier $402_1$ is coupled to bitlines BL1 and BLB1.

In this instance, a number of wordlines 406 (labeled WL0A through WL3A and WL0B through WL3B, for example) are placed orthogonally to the complementary bitline 404 pairs. To the left side of the sense amplifiers $402_0$ and $402_1$ the wordlines 406 are placed such that the highest numbered one (e.g. WL3A) is located nearest the sense amplifiers $402_0$ and $402_1$ and the lowest numbered one (e.g. WL0A) is located most remotely. The intervening wordlines 406 are placed such that they decrement between the highest and lowest numbered ones as shown.

On the other hand, to the right side of the sense amplifiers $402_0$ and $402_1$ the wordlines 406 are placed such that the lowest numbered one (e.g. WL0B) is located nearest the sense amplifiers $402_0$ and $402_1$ and the highest numbered one (e.g. WL3B) is located most remotely. The intervening wordlines 406 are placed such that they increment between the lowest and highest numbered ones as shown.

At the intersection of each of the wordlines 406 and complementary bitlines 404, a memory cell 408 is located comprising a single transistor 410 and capacitor 412, in the 1T/1C embodiment illustrated. The transistor 410 has its drain connected to one of the complementary bitlines 404, its source connected to circuit ground (VSS) through the corresponding capacitor 412 and its gate connected to one of the adjacent wordlines 406. In this embodiment, the corresponding wordlines WL1A and WL1B are enabled such as to go "active" at substantially the same time.

With respect to the embodiment of FIG. 4D in particular, the DRAM 400D comprises also comprises for purposes of illustration, two centrally located sense amplifiers $402_0$ and $402_1$ both of which are coupled to a pair of complementary bitlines 404 in an open bitline configuration. As illustrated, sense amplifier $402_0$ is coupled to distally extending bitlines BL0 and BLB0 while sense amplifier $402_1$ is coupled to bitlines BL1 and BLB1.

In this instance as well, a number of wordlines 406 (labeled WL0A through WL3A and WL0B through WL3B, for example) are placed orthogonally to the complementary bitline 404 pairs. To the left side of the sense amplifiers $402_0$ and $402_1$ the wordlines 406 are placed such that the highest numbered one (e.g. WL3A) is located nearest the sense amplifiers $402_0$ and $402_1$ and the lowest numbered one (e.g. WL0A) is located most remotely. The intervening wordlines 406 are placed such that they decrement between the highest and lowest numbered ones as shown.

On the other hand, to the right side of the sense amplifiers $402_0$ and $402_1$ the wordlines 406 are placed such that the highest numbered one (e.g. WL3B) is located nearest the sense amplifiers $402_0$ and $402_1$ and the lowest numbered one (e.g. WL0B) is located most remotely. The intervening wordlines 406 are placed such that they decrement between the highest and lowest numbered ones as shown.

At the intersection of each of the wordlines 406 and complementary bitlines 404, a memory cell 408 is located comprising a single transistor 410 and capacitor 412, in the 1T/1C embodiment illustrated. The transistor 410 has its drain connected to one of the complementary bitlines 404, its source connected to circuit ground (VSS) through the corresponding capacitor 412 and its gate connected to one of the adjacent wordlines 406. As before, in this embodiment, the corresponding wordlines WL1A and WL1B are enabled such as to go "active" at substantially the same time.

Figure 5:
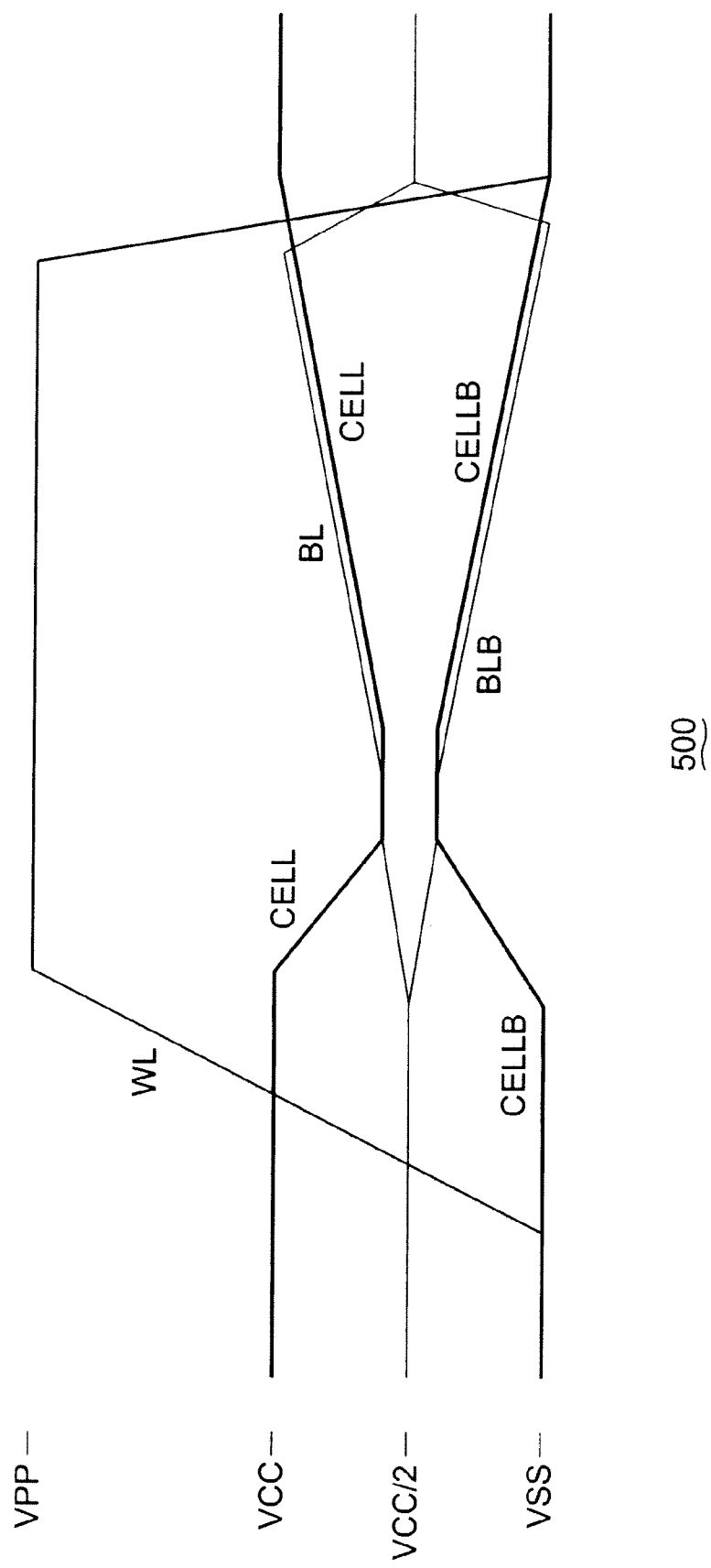
FIG. 5 illustrates some representative waveforms for an embodiment of the present invention utilizing the architecture shown in the preceding figure using a boosted wordline voltage (VPP) and a VCC/2 bitline precharge.

With reference additionally now to FIG. 5, some representative waveforms 500 are illustrated for an embodiment of the present invention utilizing the architecture shown in the preceding figure using a boosted wordline (WL) voltage (VPP) and a VCC/2 bitline precharge technique. As shown, signal is developed on the bitline pair lines BL and BLB from both CELL and CELLB memory cell nodes.

Figure 6:
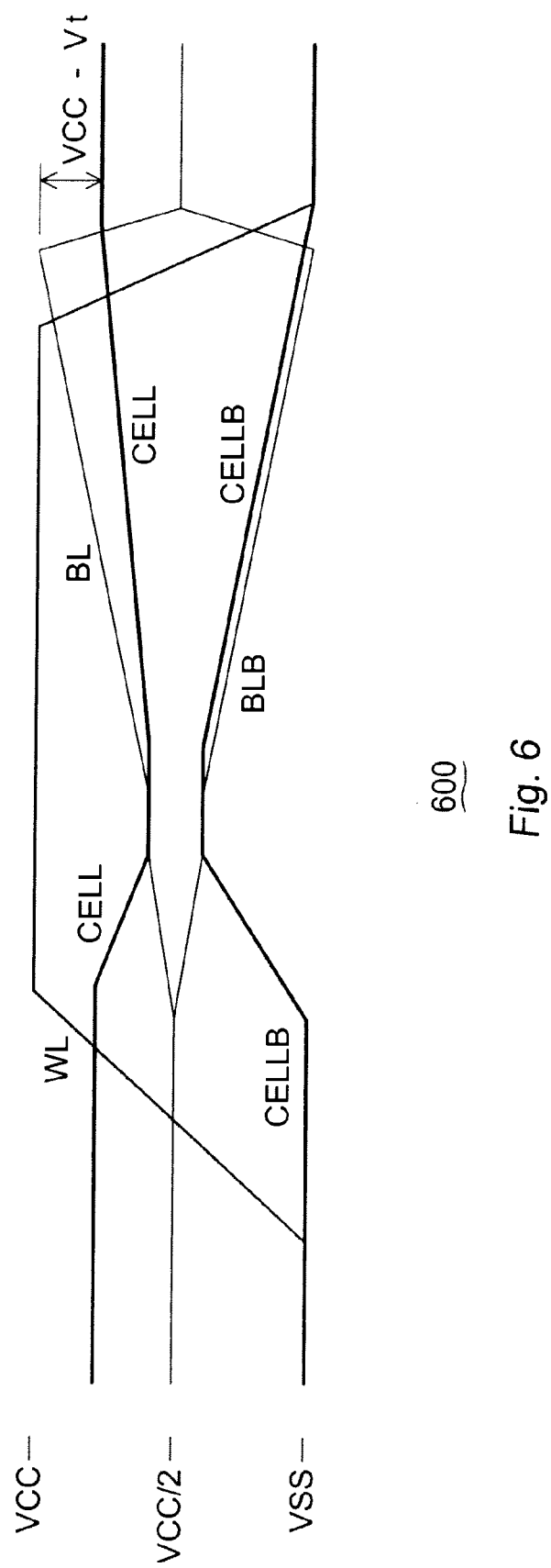
FIG. 6 illustrates some representative waveforms for an alternative embodiment of the present invention utilizing the architecture shown in FIG. 4 using a non-boosted wordline with a VCC/2 bitline precharge.

With reference additionally now to FIG. 6, some representative waveforms 600 are illustrated for an alternative embodiment of the present invention utilizing the architecture shown in FIG. 4 using a non-boosted (or VCC) wordline WL with a VCC/2 bitline precharge technique. Since there is a threshold voltage ($V_t$) drop across the pass gate memory cell device on the logic "high" level, less than VCC is restored into the cell. Because a strong "zero" is stored in the complementary cell, sufficient signal is still developed on the bitlines BL, BLB for sensing and amplification.

Figure 7:
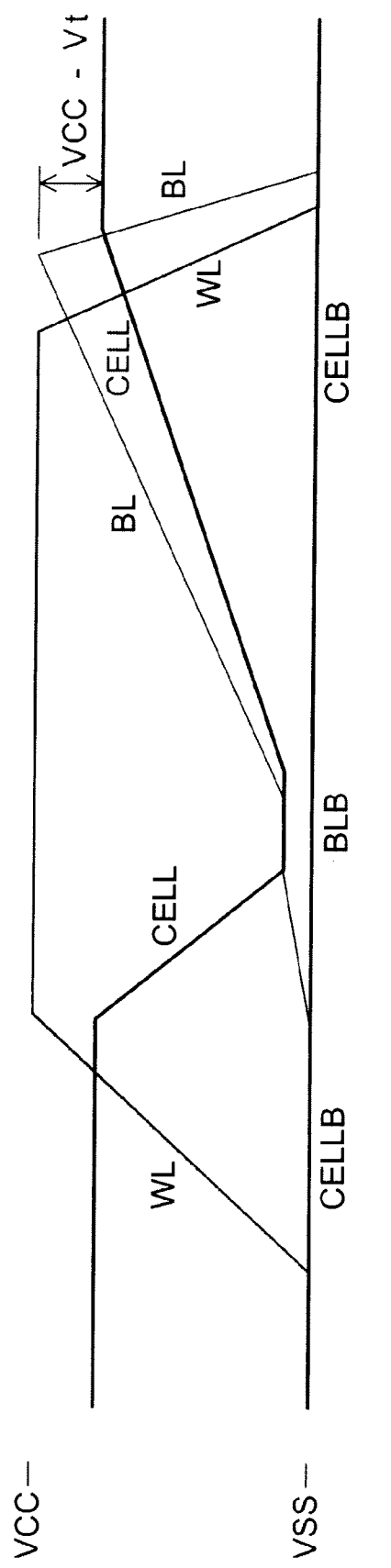
FIG. 7 illustrates some representative waveforms for another alternative embodiment of the present invention utilizing the architecture shown in FIG. 4 using a non-boosted wordline with a grounded bitline precharge technique.

With reference additionally now to FIG. 7, some representative waveforms 700 are illustrated for another alternative embodiment of the present invention utilizing the architecture shown in FIG. 4 using a non-boosted wordline with a grounded bitline precharge technique. With a grounded bitline precharge technique, the BL and BLB nodes are initialized to ground or VSS before the WL is brought "high". After the WL is brought "high", (to VCC in this instance), the signal is developed and amplified on the bitlines BL, BLB. After the restore operation is complete and the WL has returned to ground, BL and BLB are set to ground again. This approach may be implemented for both VCC and VPP level wordline "high" logic levels. Again, because there is a threshold voltage ($V_t$) drop across the pass gate memory cell device on the logic "high" level, less than VCC is restored into the cell.

Figure 8:
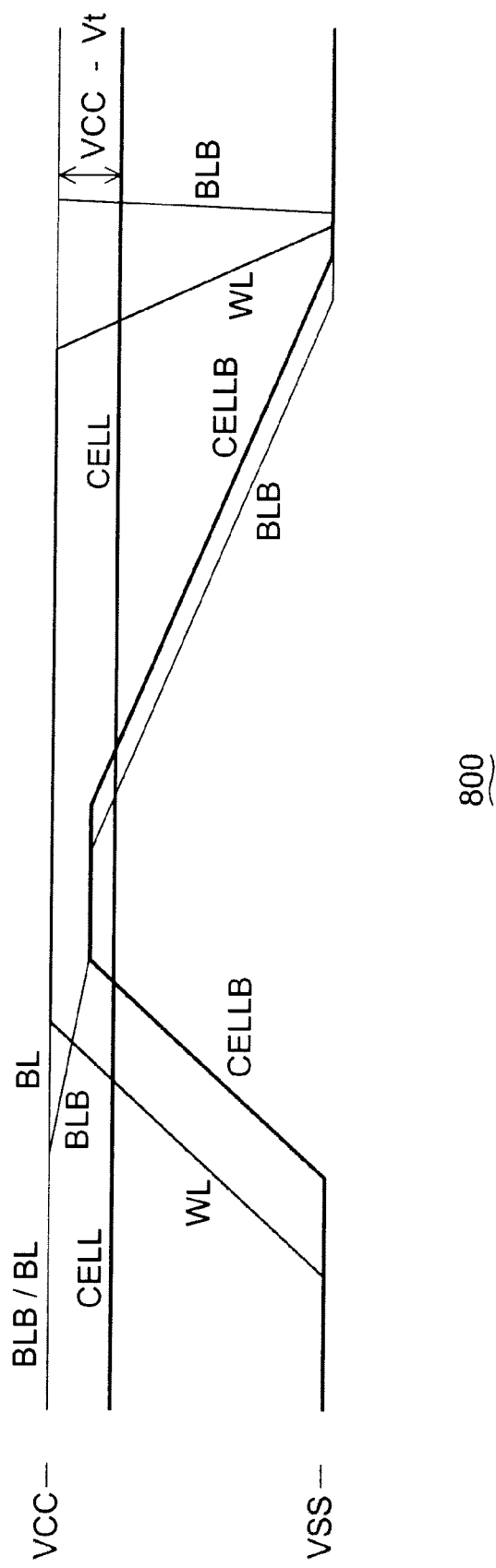
FIG. 8 illustrates some representative waveforms for yet another alternative embodiment of the present invention utilizing the architecture shown in FIG. 4 using a non-boosted wordline with a VCC bitline precharge technique.

With reference additionally now to FIG. 8, some representative waveforms 800 are illustrated for yet another alternative embodiment of the present invention utilizing the architecture shown in FIG. 4 using a non-boosted wordline with a VCC bitline precharge technique. In this example, the BL and BLB nodes are initialized to VCC before the WL is brought "high". After the WL is brought "high" (again to VCC in this instance), the signal is developed and amplified on the bitlines BL, BLB. After the restore operation is complete and the WL has returned to VSS, BL and BLB are again set to VCC. As before, because there is a threshold voltage ($V_t$) drop across the pass gate memory cell device on the logic "high" level, less than VCC is restored into the cell.

The non VCC/2 bitline precharge level embodiments of the present invention illustrated in FIGS. 7 and 8 have advantages over conventional approaches for very low VCC level operation. For VCC power supplies below 1.0 volt the transistors in the bitline sense amplifiers may not have low enough threshold voltages to operate. With VCC or grounded bitline precharge levels this design limit is doubled.

Figure 9:
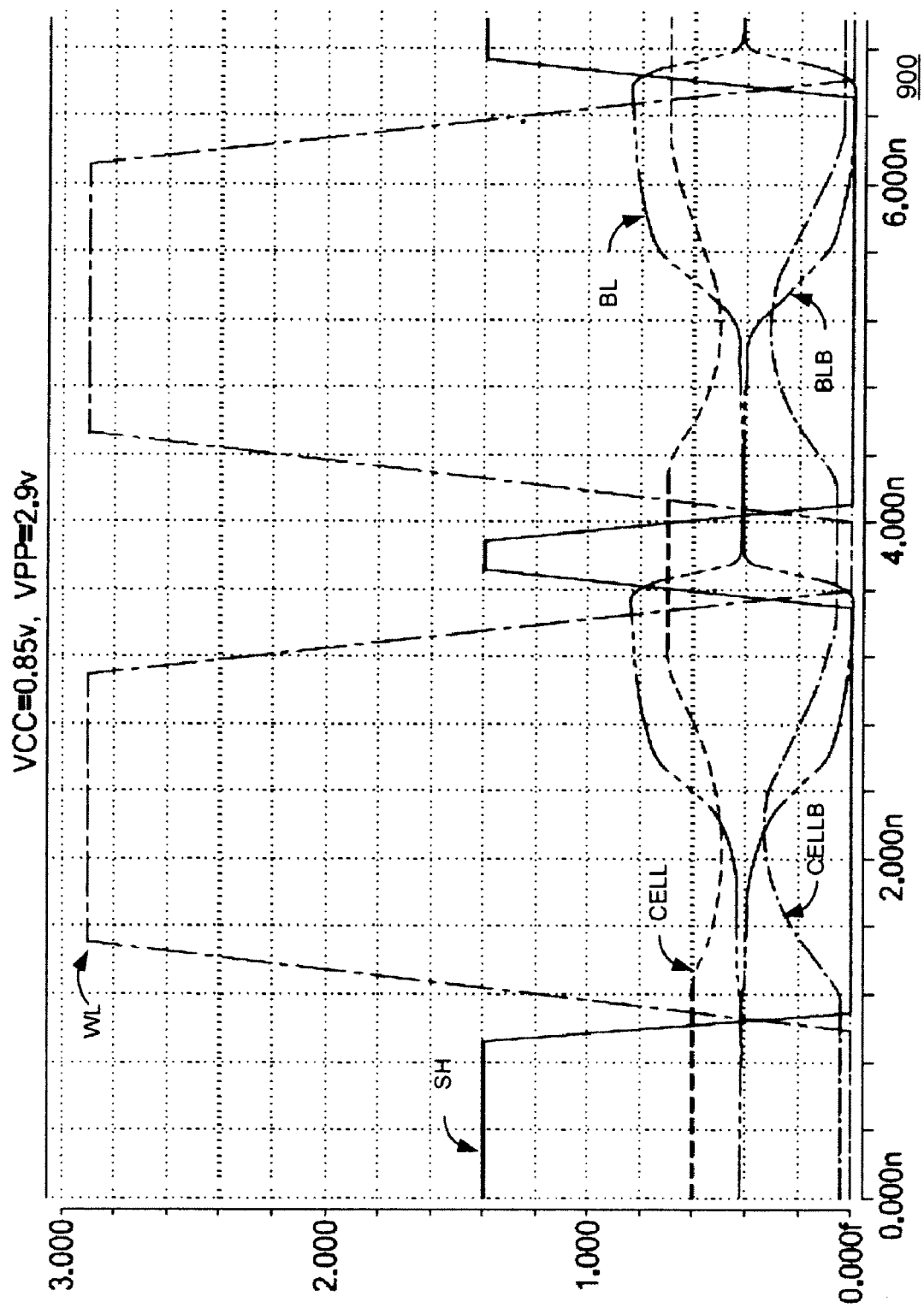
FIG. 9 illustrates some representative waveforms for still another alternative embodiment of the present invention with a wordline boosted to VPP=2.9V and VCC=0.85V wherein partial logic level "ones" and "zeroes" are implemented for optimal $t_{RC}$ speed.

With reference additionally now to FIG. 9, some representative waveforms 900 are illustrated for still another alternative embodiment of the present invention with a wordline boosted to VPP=2.9V and VCC=0.85V wherein partial logic level "ones" and "zeroes" are implemented for optimal $t_{RC}$ speed. In this figure, traces for the CELL and CELLB as well as BL and BLB voltages are shown in conjunction with the voltage for WL and SH.

While there have been described above the principles of the present invention in conjunction with a specific open bitline architecture, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device including a memory array comprising:
    at least one sense amplifier;
    at least one complementary bitline pair, a first bitline of said pair extending distally from said at least one sense amplifier in a first direction and a second bitline of said pair extending distally from said at least one sense amplifier in a second opposite direction;
    a plurality of associated wordline pairs disposed orthogonally to said first and second bitlines, a first wordline of said wordline pairs intersecting said first bitline and a second wordline of said wordline pairs intersecting said second bitline;
    a memory cell coupled to each of said first and second wordlines of said wordline pairs at an intersection with each of said first and second bitlines respectively,
    wherein said first and second wordlines of said wordline pairs are coupled together,
    wherein said memory cells comprise 1T/1C memory cells and wherein predetermined partial logic level ones and zeroes are stored in said capacitors of said 1T/1C memory cells to increase the tRC speed of said device.

2. The integrated circuit device of claim 1 wherein said first wordline of said wordline pairs is located remotely from said at least one sense amplifier and said second wordline of said wordline pairs is located proximately to said at least one sense amplifier.

3. The integrated circuit device of claim 1 wherein said first and second wordlines of said wordline pairs are located proximately to said at least one sense amplifier.

4. The integrated circuit device of claim 1 comprising a plurality of said sense amplifiers, each associated with at least one of said complementary bitline pairs.

5. The integrated circuit device of claim 1 comprising an open bitline configuration having two of said memory cells per bit.

6. The integrated circuit device of claim 1 further comprising a precharge of said bitlines to a level of substantially half of a supply voltage level and a transition of said wordlines to a level higher than said supply voltage level.

7. The integrated circuit device of claim 1 further comprising a precharge of said bitlines to a level of substantially half of a supply voltage level and a transition of said wordlines to a level substantially equal to said supply voltage level.

8. The integrated circuit device of claim 1 further comprising a precharge of said bitlines to a level of substantially circuit ground and a transition of said wordlines to a level substantially equal to said supply voltage level.

9. The integrated circuit device of claim 1 further comprising a precharge of said bitlines to a level of substantially a supply voltage level and a transition of said wordlines to a level also substantially a supply voltage level.

10. The integrated circuit device of claim 1 wherein said memory array is capable of operation with a non-pumped supply voltage level.

11. An integrated circuit device including a memory array comprising:
    at least one sense amplifier coupled to first and second complementary bitlines extending outwardly in opposite directions there from;
    first through n wordline pairs, a first wordline of each of said wordline pairs being disposed orthogonally to said first bitline and a second wordline of said wordline pairs being disposed orthogonally to said second bitline; and
    at least one memory cell coupled to said first and second complementary bitlines at a point of intersection with each of said first and second wordlines of said wordline pairs respectively,
    wherein said first and second wordlines of said wordline pairs are coupled together,
    wherein said memory cells comprise 1T/1C memory cells and wherein predetermined partial logic level ones, and zeroes are stored in said capacitors of said 1T/1C memory cells to increase the tRC speed of said device.

12. The integrated circuit device of claim 11 wherein said first wordline of said wordline pairs is located remotely from said at least one sense amplifier and said second wordline of said wordline pairs is located proximately to said at least one sense amplifier.

13. The integrated circuit device of claim 11 wherein said first and second wordlines of said wordline pairs are located proximately to said at least one sense amplifier.

14. The integrated circuit device of claim 11 comprising a plurality of said sense amplifiers, each associated with at least one of said complementary bitline pairs.

15. The integrated circuit device of claim 11 comprising an open bitline configuration having two of said memory cells per bit.

16. The integrated circuit device of claim 11 further comprising a precharge of said bitlines to a level of substantially half of a supply voltage level and a transition of said wordlines to a level higher than said supply voltage level.

17. The integrated circuit device of claim 11 further comprising a precharge of said bitlines to a level of substantially half of a supply voltage level and a transition of said wordlines to a level substantially equal to said supply voltage level.

18. The integrated circuit device of claim 11 further comprising a precharge of said bitlines to a level of substantially circuit ground and a transition of said wordlines to a level substantially equal to said supply voltage level.

19. The integrated circuit device of claim 11 further comprising a precharge of said bitlines to a level of substantially a supply voltage level and a transition of said wordlines to a level also substantially a supply voltage level.

20. The integrated circuit device of claim 11 wherein said memory array is capable of operation with a non-pumped supply voltage level.

21. An integrated circuit device comprising:
    a plurality of sense amplifiers;
    a like plurality of complementary bitline pairs, a respective one of said plurality complementary bitline pairs being coupled to each one of said plurality of sense amplifiers in an open bitline configuration; and
    wherein said complementary bitlines extend outward in opposite directions there from;
    a plurality of wordlines disposed orthogonally to said complementary bitline pairs; and
    at least two memory cells coupled to each of said plurality of wordlines and each of said complementary bitline pairs,
    a first memory cell being coupled to a first wordline, a second memory cell being coupled to a second wordline, and said first and second wordlines being coupled together,
    wherein said memory cells comprise 1T/1C memory cells and wherein predetermined partial logic level ones and zeroes are stored in said capacitors of said 1T/1C memory cells to increase the tRC speed of said device.

22. The integrated circuit device of claim 21 wherein each of said memory cells comprises a 1T/1C memory cell.

23. An integrated circuit device comprising:
a sense amplifier;
a first bitline extending from said sense amplifier in a first direction;
a complementary second bitline extending from said sense amplifier in a second opposite direction;
1 through n wordlines disposed orthogonally to each of said first and second bitlines; and
a memory cell coupled to each of said wordlines and each of said first and second bitlines,
wherein a first memory cell is coupled to a first wordline associated with the first bitline,
a second memory cell is coupled to a second wordline associated with the second bitline, and said first and second wordlines are coupled together,
wherein said memory cells comprise 1T/1C memory cells and wherein predetermined partial logic level ones and zeroes are stored in said capacitors of said 1T/1C memory cells to increase the tRC speed of said device.

24. The integrated circuit device of claim 1 wherein said first and second wordlines of said wordline pairs are activated substantially concurrently.

25. The integrated circuit device of claim 11 wherein said first and second wordlines of said wordline pairs are activated substantially concurrently.

26. The integrated circuit device of claim 1 wherein said memory cells comprise 1T/1C memory cells and wherein predetermined partial logic level ones and zeroes are used to develop bit line signals to increase the $t_{RC}$ speed of said device.

27. The integrated circuit device of claim 1 wherein said memory cells comprise 1T/1C memory cells and wherein a bit line signal thereof is purposely not fully developed to increase the $t_{RC}$ speed of said device.

28. The integrated circuit device of claim 11 wherein said memory cells comprise 1T/1C memory cells and wherein predetermined partial logic level ones and zeroes are used to develop bit line signals to increase $t_{RC}$ speed of said device.

29. The integrated circuit device of claim 11 wherein said memory cells comprise 1T/1C memory cells and wherein a bit line signal thereof is purposely not fully developed to increase the $t_{RC}$ speed of said device.

30. The integrated circuit device of claim 21 wherein said memory cells comprise 1T/1C memory cells and wherein predetermined partial logic level ones and zeroes are used to develop bit line signals to increase $t_{RC}$ speed of said device.

31. The integrated circuit device of claim 21 wherein said memory cells comprise 1T/1C memory cells and wherein a bit line signal thereof is purposely not fully developed to increase the $t_{RC}$ speed of said device.

32. The integrated circuit device of claim 23 wherein said memory cells comprise 1T/1C memory cells and wherein predetermined partial logic level ones and zeroes are used to develop bit line signals to increase $t_{RC}$ speed of said device.

33. The integrated circuit device of claim 23 wherein said memory cells comprise 1T/1C memory cells and wherein a bit line signal thereof is purposely not fully developed to increase the $t_{RC}$ speed of said device.

* * * * *